US010184171B2

(12) United States Patent
Ryuichi et al.

(10) Patent No.: US 10,184,171 B2
(45) Date of Patent: Jan. 22, 2019

(54) SPUTTERING APPARATUS AND METHOD THEREOF

(71) Applicant: Samsung Electronics Co., Ltd., Suwon-Si, Gyeonggi-Do (KR)

(72) Inventors: Satoh Ryuichi, Numazu-si (JP); Kyu Sik Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/602,469

(22) Filed: Jan. 22, 2015

(65) Prior Publication Data

US 2015/0376774 A1 Dec. 31, 2015

(30) Foreign Application Priority Data

Jun. 30, 2014 (KR) ........................ 10-2014-0080571

(51) Int. Cl.
| | |
|---|---|
| *C23C 14/34* | (2006.01) |
| *C23C 14/35* | (2006.01) |
| *H01J 37/34* | (2006.01) |
| *C23C 14/22* | (2006.01) |
| *C23C 14/00* | (2006.01) |
| *C23C 14/08* | (2006.01) |

(52) U.S. Cl.
CPC ........ *C23C 14/352* (2013.01); *C23C 14/0068* (2013.01); *C23C 14/086* (2013.01); *C23C 14/225* (2013.01); *H01J 37/3405* (2013.01); *H01J 37/3417* (2013.01); *H01J 37/3438* (2013.01); *H01J 37/3447* (2013.01); *H01J 37/3467* (2013.01)

(58) Field of Classification Search
CPC .............. H01J 37/3438; H01J 37/3447; C23C 14/0068; C23C 14/225
See application file for complete search history.

(56) References Cited

U.S. PATENT DOCUMENTS

| | | | | |
|---|---|---|---|---|
| 4,911,814 A | * | 3/1990 | Matsuoka | ............. C23C 14/357 204/192.12 |
| 5,026,087 A | | 6/1991 | Wulf et al. | |
| 5,156,703 A | * | 10/1992 | Oechsner | .......... H01J 37/32357 118/723 ER |
| 5,279,669 A | * | 1/1994 | Lee | ........................ B01J 19/126 118/723 I |
| 2003/0094365 A1 | * | 5/2003 | Kadokura | ............. C23C 14/352 204/298.18 |

(Continued)

FOREIGN PATENT DOCUMENTS

| | | |
|---|---|---|
| JP | 20080075165 A | 4/2008 |
| JP | 20080196023 A | 8/2008 |

(Continued)

*Primary Examiner* — Jason Berman
(74) *Attorney, Agent, or Firm* — Harness, Dickey & Pierce, P.L.C.

(57) ABSTRACT

A method of forming a layer including disposing a first target and a second target to face each other with a first space therebetween, disposing a substrate to face the first space, generating plasma between the first target and the second target to perform sputtering on the substrate, disposing a capture net between the substrate and the the first space, and capturing anions and/or electrons that propagate toward the substrate from the first space.

10 Claims, 4 Drawing Sheets

(56) References Cited

U.S. PATENT DOCUMENTS

2008/0210546 A1* 9/2008 Ukishima ............ C23C 14/0068
204/192.12

FOREIGN PATENT DOCUMENTS

| JP | 5026087 B2 | 9/2012 |
| KR | 1002351 A | 6/2005 |
| KR | 20120113994 A | 10/2012 |

* cited by examiner

SPUTTERING APPARATUS AND METHOD THEREOF

CROSS-REFERENCE TO RELATED APPLICATIONS

This U.S. non-provisional patent application claims priority under 35 U.S.C. § 119 to Korean Patent Application No. 10-2014-0080571, filed on Jun. 30, 2014, in the Korean Intellectual Property Office, the entire contents of which are incorporated herein by reference.

BACKGROUND

1. Field

This disclosure relates to sputtering apparatuses and/or methods for forming a thin film.

2. Description of the Related Art

In order to fabricate a semiconductor, or a display device, thin films may be formed and patterned. Forming a high quality thin film having substantially no or a relatively low level of damage is desirable to form a fine pattern by patterning the thin film. The thin film may be formed by various methods such as chemical vapor deposition (CVD), atomic layer deposition, and sputtering depending upon material of thin film or an objective of forming the thin film. The sputtering is one of evaporation technique, and generates plasma at a relatively low temperature by accelerating a gas such as argon, colliding the same to a target, and having atoms or molecules emit from the targets. The emitted atoms or molecules are used to form a thin film layer on a substrate.

When the thin film is formed by the sputtering, ions, electrons, or the like as well as the material for forming the thin film are emitted. The emitted ions and/or electrons collide with a substrate thereby causing problems such as damage to the thin film to be formed or other thin films previously formed on the substrate.

SUMMARY

Some example embodiments provide sputtering apparatuses which may prevent or mitigate damage to a thin film caused by a by-product when forming a thin film according to a sputtering method, and methods of forming a thin film using the same.

According to an example embodiment, the sputtering apparatus includes a first target mounting portion, a second target mounting portion disposed to face the first target mounting portion with a first space therebetween, a first electrode disposed a second space from the first target mounting portion; a second electrode disposed a third space from the second target mounting portion, the second electrode being opposite to the first electrode, a power supply portion applying a voltage between the first target mounting portion and the first electrode and between the second target mounting portion and the second electrode, a substrate mounting stand disposed to face an area between the first target mounting portion and the second target mounting portion; and a capture net disposed between the first space and the substrate mounting stand.

According to some example embodiments, the capture net may be configured to capture at least one of electrons and anions. The capture net may be configured to be grounded. The capture net may be made of a material having an electrical conductivity. The material for the capture net may have a relative dielectric constant of less than or equal to about 1.2. The material for the capture net may include at least one of silver, copper, lead, aluminum, and palladium.

According to some example embodiments, the capture net may have at least one shape of a lattice, a spider web, and a shape of binding a plurality of concentric circles with radiation lines connecting the same.

According to some example embodiments, the first target mounting portion and the second target mounting portion may each function as magnets, and may form a magnetic field powered by a direct current (DC) power therebetween.

According to some example embodiments, at least one of DC, RF (radio frequency), or a pulsed electric field may be applied between the first target mounting portion and the first electrode and between the second target mounting portion and the second electrode.

According to an example embodiments, a method of forming a layer includes disposing a first target and a second target to face each other with a first space therebetween, disposing a substrate to face the first space, generating plasma between the first target and the second target to perform sputtering on the substrate, capturing at least one of anions and electrons that propagate toward the substrate from the first space. The capturing may include disposing a capture net between the first space and the substrate and grounding the capture net.

The capture net may include a material having a relative dielectric constant of less than or equal to about 1.2. The material for the capture net may include at least one of silver, copper, lead, aluminum, and palladium. The capture net may have at least one shape of a lattice, a spider web, and a shape binding a plurality of concentric circles with radiation lines connecting the same.

According to methods of some example embodiments, the disposing, the generating and the capturing cooperatively form an ITO layer having a thickness of less than or equal to about 100 nm on the substrate.

DETAILED DESCRIPTION

Figure 1:
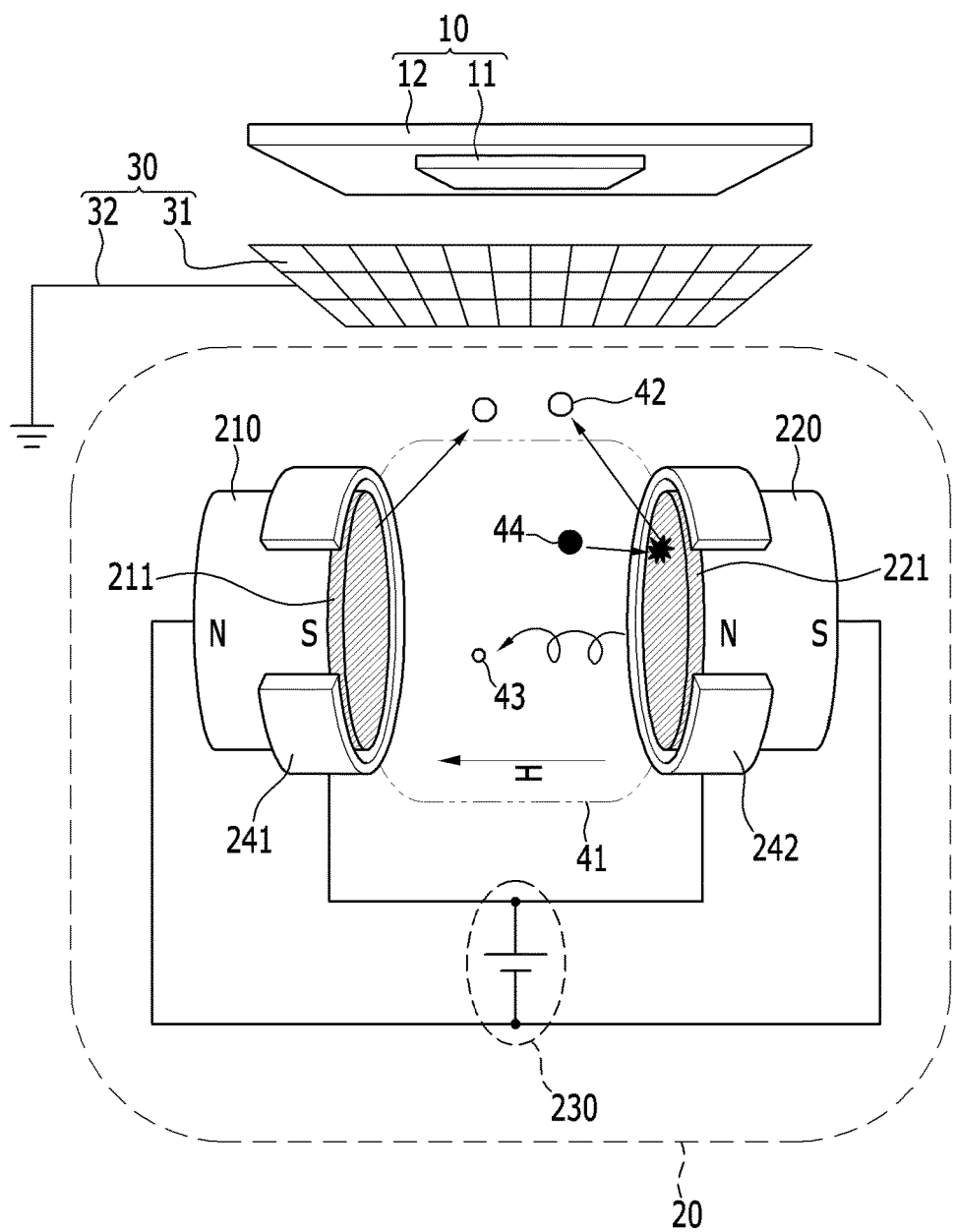
FIG. 1 is a schematic view of a sputtering apparatus according to an example embodiment.

Various example embodiments will be described more fully hereinafter with reference to the accompanying drawings, in which some example embodiments are shown. As those skilled in the art would realize, the described example embodiments may be modified in various different ways, all without departing from the spirit or scope of example embodiments. Rather, these example embodiments are merely provided so that this disclosure will be thorough and complete, and will fully convey the scope of example embodiments to those skilled in the art. In the drawings, the sizes and relative sizes of the various layers and regions may have been exaggerated for clarity. Like numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, some example embodiments will be explained in further detail with reference to the accompanying drawings.

First, referring to FIG. 1, a sputtering apparatus according to an example embodiment is described.

FIG. 1 is a schematic view of a sputtering apparatus according to an example embodiment.

The sputtering apparatus according to an example embodiment includes a substrate mounting unit 10, a plasma generating unit 20, and an ion and electron capture unit 30 provided between the substrate mounting unit 10 and the plasma generating unit 20. The substrate mounting unit 10, the plasma generating unit 20, and the ion and electron capture unit 30 are provided in a process chamber (not shown).

The substrate mounting unit 10 includes a substrate mounting stand 12, on which a substrate 11 is to be placed.

The plasma generating unit 20 includes target mounting portions 210 and 220 facing each other and mounted with respective targets 211 and 221, the opposing electrodes 241 and 242 disposed a desired (or alternatively, predetermined) interval from respective targets 211 and 221, and a power supply 230 applying a desired (or alternatively, predetermined) voltage between the target mounting portions 210 and 220 and the opposing electrodes 241 and 242. The targets 211 and 221 are respectively mounted on the target mounting portions 210 and 220. When the power supply 230 applies a desired (or alternatively, predetermined) voltage between the targets 211 and 221 and the opposing electrodes 241 and 242, the targets 211 and 221 may be configured to act as negative electrodes, and the opposing electrodes 241 and 242 may be configured to act as positive electrodes. The target mounting portions 210 and 220 each may act as magnets, and form a magnetic field (H) powered by a direct current (DC) power between the targets 211 and 221 facing each other. The electric field formed between the target mounting portions 211 and 221 and the opposing electrodes 241 and 242 may be, for example, a DC, an RF (radio frequency), or a pulsed electric field. In the plasma generating unit 20 according to the present example embodiment, secondary electrons 43 emitted from the surface of the targets 211 and 221 and/or electrons generated during discharge may move around the direct current magnetic field formed between the targets 211 and 221 by Lorentz force, move back and forth between the pair of targets 211 and 221, and collide with plasma generating gas atoms such as argon, thereby accelerating plasma generation. Thus, plasma 41 may be formed substantially within an area between the targets 211 and 221, and the substrate 11 may be disposed outside the area between the targets 211 and 221 (hereinafter, "a plasma forming area"). Cations 44 generated by collision of the plasma generation gas atom and electrons may be accelerated toward and collide with the targets 211 and 221, which act as negative electrodes, to emit atoms or molecules 42 of the targets 211 and 221. The emitted atoms or molecules 42 of the targets 211 and 221 may be deposited on the substrate 11 to form a thin film. In this case, some of the electron or anions generated in the plasma forming area may be scattered toward the substrate 11 and cause damage to the thin film to be formed or previously formed on the substrate 11.

Although the sputtering apparatus according to the present example embodiment includes the pair of opposing electrodes 241 and 242 and target mounting portions 210 and 220, the configurations of opposing electrodes and the target mounting portions are not limited thereto. For example, the opposing electrodes and the target mounting portions may be disposed in a plurality of pairs. When the plurality of pairs of opposing electrodes and target mounting portions are disposed, the time for forming a thin film may be shortened, and thus damage to the thin film may be reduced.

In the sputtering apparatus according to an example embodiment, the ion and electron capture unit 30 is disposed between the plasma generating unit 20 and the substrate mounting unit 10 in order to prevent or mitigate the electrons or anions generated in the plasma forming area from scattering toward the substrate 11 and damaging the thin film to be formed or previously formed on the substrate 11.

The ion and electron capture unit 30 includes a capture net 31 and a discharging line 32 for discharging the captured electrons or ions. The capture net 31 may have a mesh type structure. The discharging line 32 discharges electrons and/or anions from the sputtering apparatus. For example, the discharging line 32 may be grounded. The capture net 31 may have various shapes, for example, a lattice shape, a spider web shape, a shape of binding a plurality of concentric circles and radiation lines connecting the same, etc. The material for the capture unit 30 may include any material as long as it is electrically conductive. For example, silver, copper, lead, aluminum, palladium, or the like are less affected by the magnetic field of the plasma forming area and have relatively good characteristics as a material for a capture portion 30 because such materials have a relatively good electrical conductivity and a low relative dielectric constant of less than or equal to about 1.2.

A method of forming a thin film using the sputtering apparatus according to an example embodiment is explained.

First, the substrate 11, on which a thin film is to be formed, is placed on the substrate mounting stand 12. The substrate 11 is placed on the substrate mounting stand 12 using vacuum adsorption or using other fastening means. The targets 211 and 221 are mounted to face each other in the target mounting portions 210 and 220. The targets 211 and 221 are mounted to be electrically connected with the target mounting portions 210 and 220.

Then power is supplied to the plasma generating unit 20 to generate plasma such that the sputtering is performed. Atoms or molecules emitted from the target through the sputtering may be deposited on the substrate. In this case, some electrons and anions among the electrons and anions generated by the plasma generating unit 20 may propagate toward the substrate 11, may be captured by the capture net 31 of the ion and electron capture unit 30, and be discharged through the discharging line 32. As atoms or molecules emitted from the target through the sputtering are electrically neutral, most of the emitted atoms or molecules pass through the capture net 31 and arrive at the substrate 11.

When the sputtering is performed for a desired (or alternatively, preset or predetermined) time to provide a thin film having a desirable thickness, the power supply is stopped, and the substrate 11 is dismounted from the substrate mounting stand 12 and is taken out.

When an ITO layer is formed using a sputtering apparatus according to an example embodiment, a desired time for forming the ITO layer having a thickness of less than or equal to about 100 nm, for example, of less than or equal to about 10 nm may be relatively shorten. Thus, the ITO layer may be less damaged.

Figure 2:
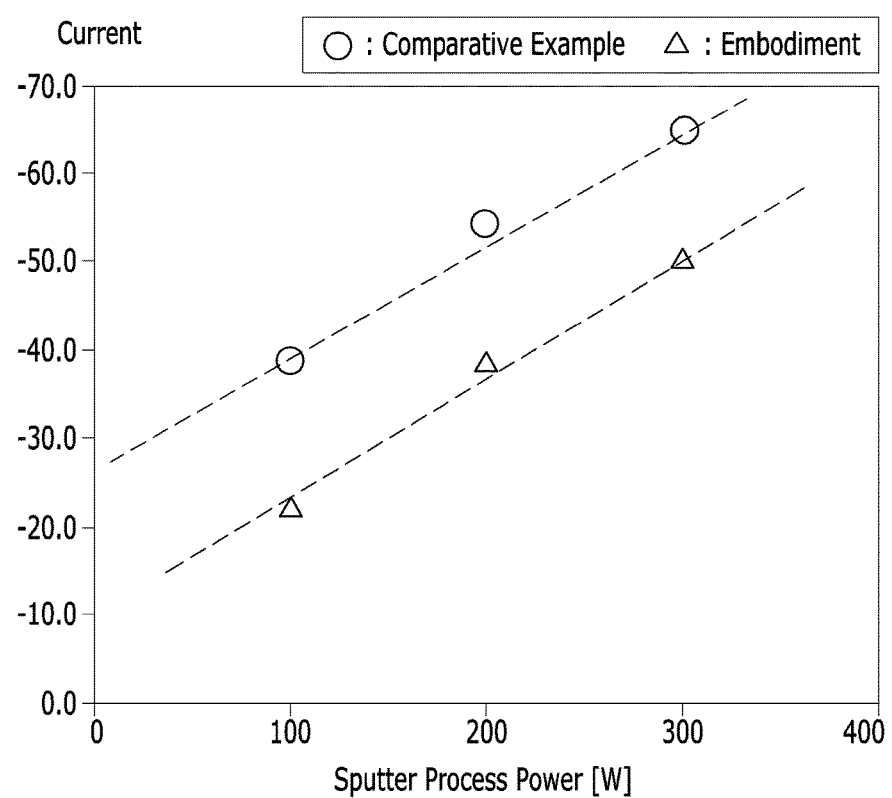
FIG. 2 is a graph showing an amount of electrons arriving at a substrate in a sputtering apparatus according to an example embodiment and a sputtering apparatus in which a capture net is not provided (comparative example).

FIG. 2 is a graph showing an electron amount arriving at a substrate in a sputtering apparatus according to an example embodiment and a sputtering apparatus in which a capture net is not provided (comparative example).

As shown in FIG. 2, as the sputtering power is increased, the electron amount arriving at the substrate proportionally increases, regardless of the example embodiment or the comparative example. However, the example embodiment shows a lesser electron amount arriving at the substrate compared to that of the comparative example. Accordingly, this graph shows that the ion and electron capture unit 30 of the example embodiment prevents or mitigates anions and electrons from arriving at the substrate.

Figure 3:
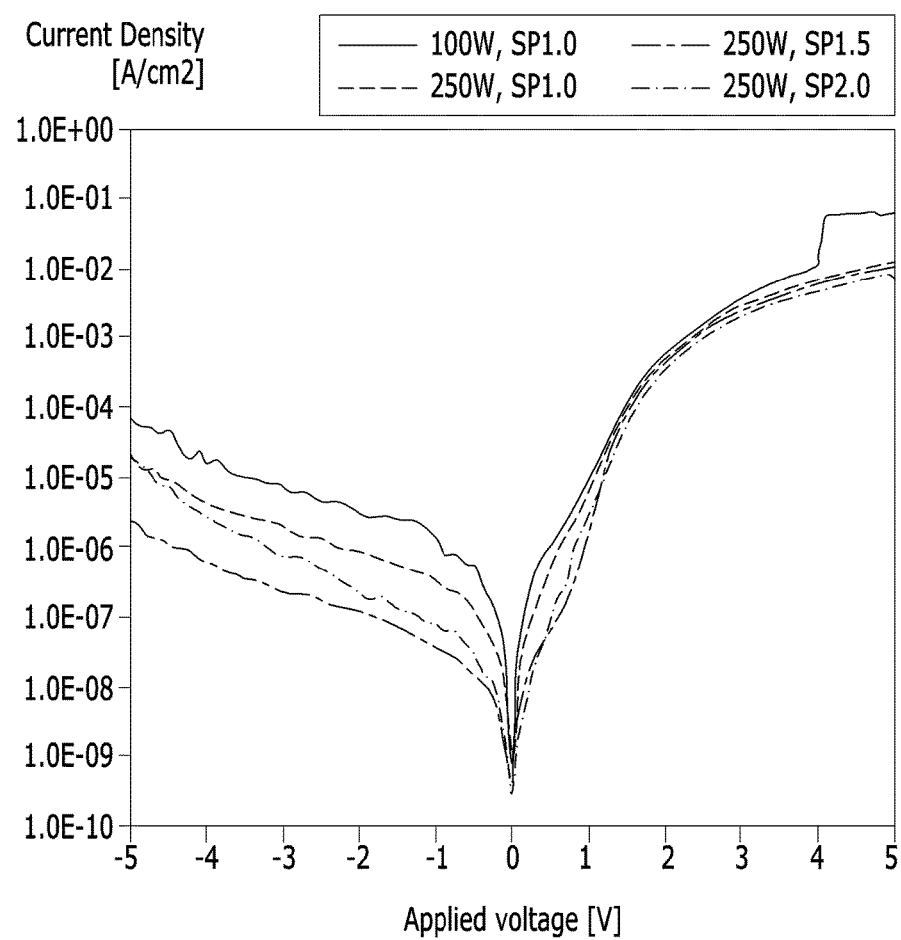
FIG. 3 is a graph showing conductivity of several thin films formed under various conditions using a sputtering apparatus in which a capture net is not provided (comparative example).
Figure 4:
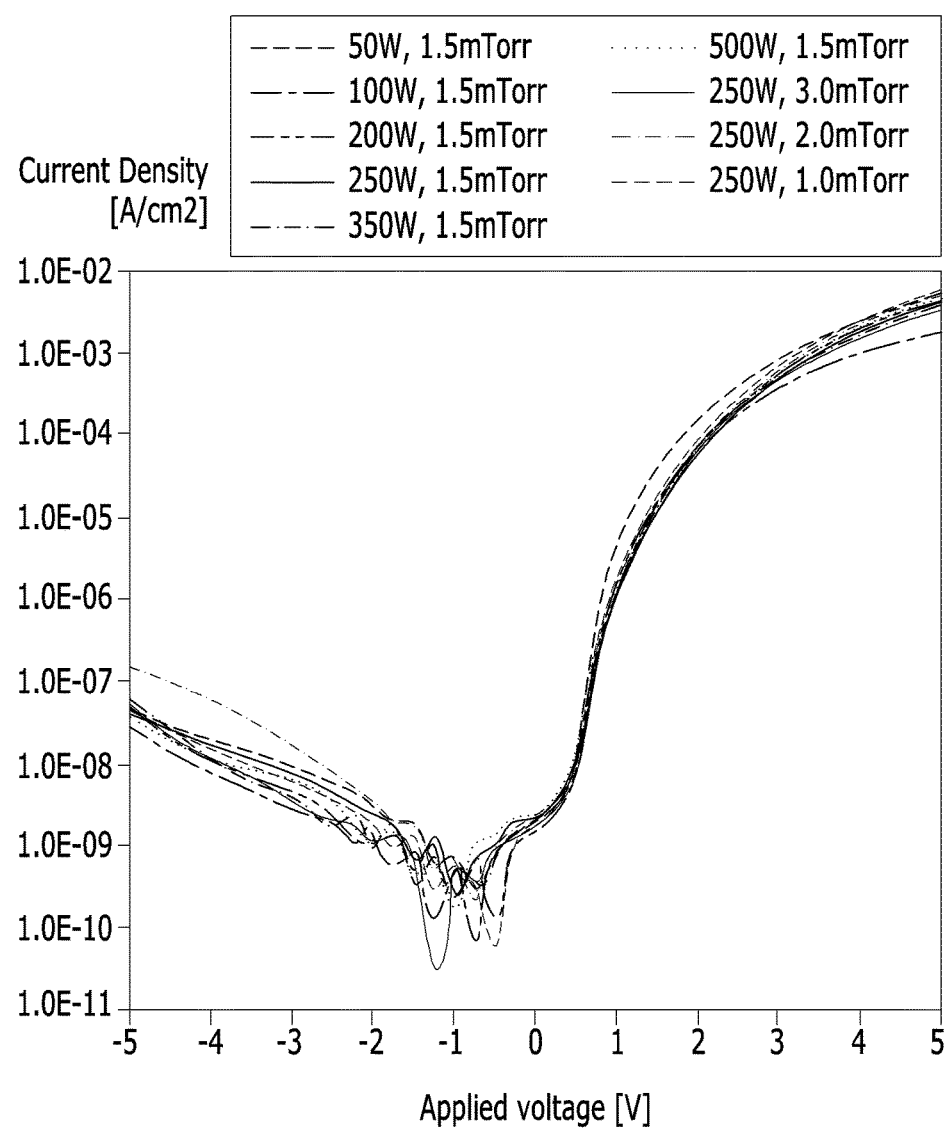
FIG. 4 is a graph showing conductivity of several thin films formed under the various conditions using a sputtering apparatus according to an example embodiment.

FIG. 3 is a graph showing conductivity of several thin films formed under various conditions using a sputtering apparatus in which a capture net is not provided (comparative example); and FIG. 4 is a graph showing conductivity of several thin films formed under the various conditions using a sputtering apparatus according to an example embodiment.

According to the comparative example of FIG. 3, current densities change between about 1.0E-04 and about 1.0E-06 according to sputtering conditions when a voltage of −5 V is applied. According to the example embodiment of FIG. 4, current densities are around 1.0E-07 when a voltage of −5 V is applied and change within a relatively small range even if sputtering conditions change, compared to the comparative example of FIG. 3. Further, referring to FIG. 4, the curves are closely distributed within a narrow range of current density values compared to those of FIG. 3. This means that the thin film formed using a sputtering apparatus according to an example embodiment has relatively uniform electrical characteristics regardless of the sputtering condition. This also means that the sputtering process using the sputtering apparatus according to an example embodiment may have a relatively wide process margin.

As stated above, the high-quality thin film may be fabricated due to a wide process margin provided by the sputtering apparatus according to an example embodiment.

While this disclosure has been described in connection with what is presently considered to be practical example embodiments, it is to be understood that example embodiments are not limited to the disclosed example embodiments, but, on the contrary, is intended to cover various modifications and equivalent arrangements included within the spirit and scope of the appended claims.

What is claimed is:

1. A sputtering apparatus for forming a thin film comprising:
   a first target mounting portion;
   a second target mounting portion facing the first target mounting portion with a first space therebetween, the first space being a plasma forming area;
   a first electrode spaced apart from the first target mounting portion by a second space;
   a second electrode spaced apart from the second target mounting portion by a third space, the second electrode being opposite to the first electrode;
   a power supply portion configured to apply a voltage between the first target mounting portion and the first electrode and between the second target mounting portion and the second electrode;
   a substrate mounting stand configured to mount a substrate, the substrate mounting stand facing the first space; and
   a capture net between the first space and the substrate mounting stand,
   wherein the first target mounting portion and the second target mounting portion each function as magnets to provide a magnetic field therebetween, and the first electrode and the second electrode face each other and align in a first direction such that the sputtering apparatus generates cations using collision between a plasma generation gas atom and electrons, accelerates the cations along the first direction, and emits atoms or molecules from at least one of the first target or the second target by colliding the cations with the at least one of the first target or the second target in response to application of the voltage,
   a substrate is mounted on the substrate mounting stand and being parallel to the first direction,
   the capture net is configured to be grounded, the capture net includes a material having a relative dielectric constant of less than or equal to about 1.2 and has an electrical conductivity, and the capture net is configured to, capture at least one of anions or the electrons scattered from the plasma forming area and propagating toward the substrate from the first space, and pass at least one of the atoms or the molecules.

2. The sputtering apparatus of claim 1, wherein the material included in the capture net includes at least one of silver, copper, lead, aluminum, or palladium.

3. The sputtering apparatus of claim 1, wherein the capture net has at least one of a lattice shape, a spider web shape, or a shape of binding a plurality of concentric circles with radiation lines.

4. The sputtering apparatus of claim 1, wherein the first target mounting portion and the second target mounting portion each function as magnets such that a magnetic field powered by a direct current (DC) power is provided therebetween.

5. The sputtering apparatus of claim 1, wherein at least one of a magnetic field powered by a direct current (DC) power, radio frequency (RF) electric field, or a pulsed electric field is applied between the first target mounting portion and the first electrode and between the second target mounting portion and the second electrode.

6. A method of forming a thin film layer comprising:

disposing a first target on a first target mounting portion and a second target on a second target mounting portion such that the first target faces the second target with a first space therebetween, the first space being an area in which plasma is to be formed;

disposing a first electrode to be spaced apart from the first target mounting portion by a second space and a second electrode to be spaced apart from the second target mounting portion by a third space and to be opposite to the first electrode such that the first electrode and the second electrode are aligned to each other in a first direction;

providing a magnetic field between the first target mounting portion and the second target mounting portion, the first target mounting portion and the second target mounting portion each functioning as magnets;

disposing a substrate on a substrate mounting stand such that the substrate faces the first space, and is mounted to be parallel to the first direction;

generating plasma between the first target and the second target to perform sputtering on the substrate;

generating cations using collision between a plasma generation gas atom or electrons;

accelerating the cations along the first direction;

emitting atoms or molecules from at least one of the first target or the second target by colliding the cations with the at least one of first target or second target;

disposing a capture net, the capture net including a material having a relative dielectric constant of less than or equal to about 1.2 and having an electrical conductivity;

grounding the capture net;

capturing, using the capture net, at least one of anions or the electrons scattered from the plasma forming area and propagating toward the substrate from the first space; and passing at least one of the atoms or the molecules emitted from the first and second targets through the capture net.

7. The method of claim 6, wherein the capturing comprises:

disposing the capture net between the first space and the substrate.

8. The method claim 6, wherein the material included in the capture net includes at least one of silver, copper, lead, aluminum, or palladium.

9. The method of claim 8, wherein the capture net has at least one of a lattice shape, a spider web shape, or a shape binding a plurality of concentric circles with radiation lines.

10. The method of claim 6, wherein the disposing, the generating, and the capturing cooperatively form an ITO layer having a thickness of less than or equal to about 100 nm on the substrate.

* * * * *